(12) United States Patent
Lohr et al.

(10) Patent No.: US 8,189,312 B2
(45) Date of Patent: May 29, 2012

(54) CIRCUIT ARRANGEMENT FOR DETECTING UNDERVOLTAGE IN AN ENERGY SOURCE

(75) Inventors: Guenter Lohr, Leinfelden-Echterdingen (DE); Andreas Kynast, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 605 days.

(21) Appl. No.: 12/296,226

(22) PCT Filed: Apr. 25, 2007

(86) PCT No.: PCT/EP2007/054034
§ 371 (c)(1),
(2), (4) Date: Oct. 6, 2008

(87) PCT Pub. No.: WO2007/147666
PCT Pub. Date: Dec. 27, 2007

(65) Prior Publication Data
US 2009/0168284 A1    Jul. 2, 2009

(30) Foreign Application Priority Data

Jun. 20, 2006  (DE) .......................... 10 2006 028 708

(51) Int. Cl.
*H02H 3/24* (2006.01)
(52) U.S. Cl. ........................................................ 361/92
(58) Field of Classification Search ...................... 361/92
See application file for complete search history.

(56) References Cited

U.S. PATENT DOCUMENTS

| | | | |
|---|---|---|---|
| 3,670,246 A | 6/1972 | Gately | |
| 3,754,182 A * | 8/1973 | Morris et al. | ................. 323/299 |
| 4,017,789 A * | 4/1977 | Morris | ........................ 323/285 |
| 4,829,290 A | 5/1989 | Ford | |
| 5,175,487 A | 12/1992 | Inoue | |
| 5,508,874 A | 4/1996 | Williams et al. | |
| 5,617,285 A | 4/1997 | Zitta | |
| 5,959,436 A | 9/1999 | Takashina et al. | |
| 7,112,900 B2 * | 9/2006 | Brotto | ........................ 307/326 |

FOREIGN PATENT DOCUMENTS

| | | |
|---|---|---|
| DE | 1 463 539 | 4/1969 |
| EP | 0 207 159 | 1/1987 |
| EP | 0 698 794 | 2/1996 |
| JP | 1-270117 | 10/1989 |
| JP | 1303053 | 12/1989 |
| JP | 2002-358130 | 12/2002 |
| JP | 2003-316452 | 11/2003 |
| WO | 2004/073033 | 8/2004 |

OTHER PUBLICATIONS

JP2006-518181, Published Aug. 3, 2006 (English Abstract Only).

* cited by examiner

*Primary Examiner* — Rexford Barnie
*Assistant Examiner* — Christopher Clark
(74) *Attorney, Agent, or Firm* — Michael J. Striker

(57) ABSTRACT

A circuit arrangement (10) for detecting undervoltage in an energy source (12) includes a transistor switch (48) and at least one further switch element (30). The transistor switch (48) and the further switch element (30) are of low impedance in an operating state of the circuit arrangement (10). The transistor switch (48) blocks the further switch element (30) for interrupting the voltage supply if a supply voltage (U) of the energy source (12) is below a defined voltage value ($U_s$).

10 Claims, 1 Drawing Sheet

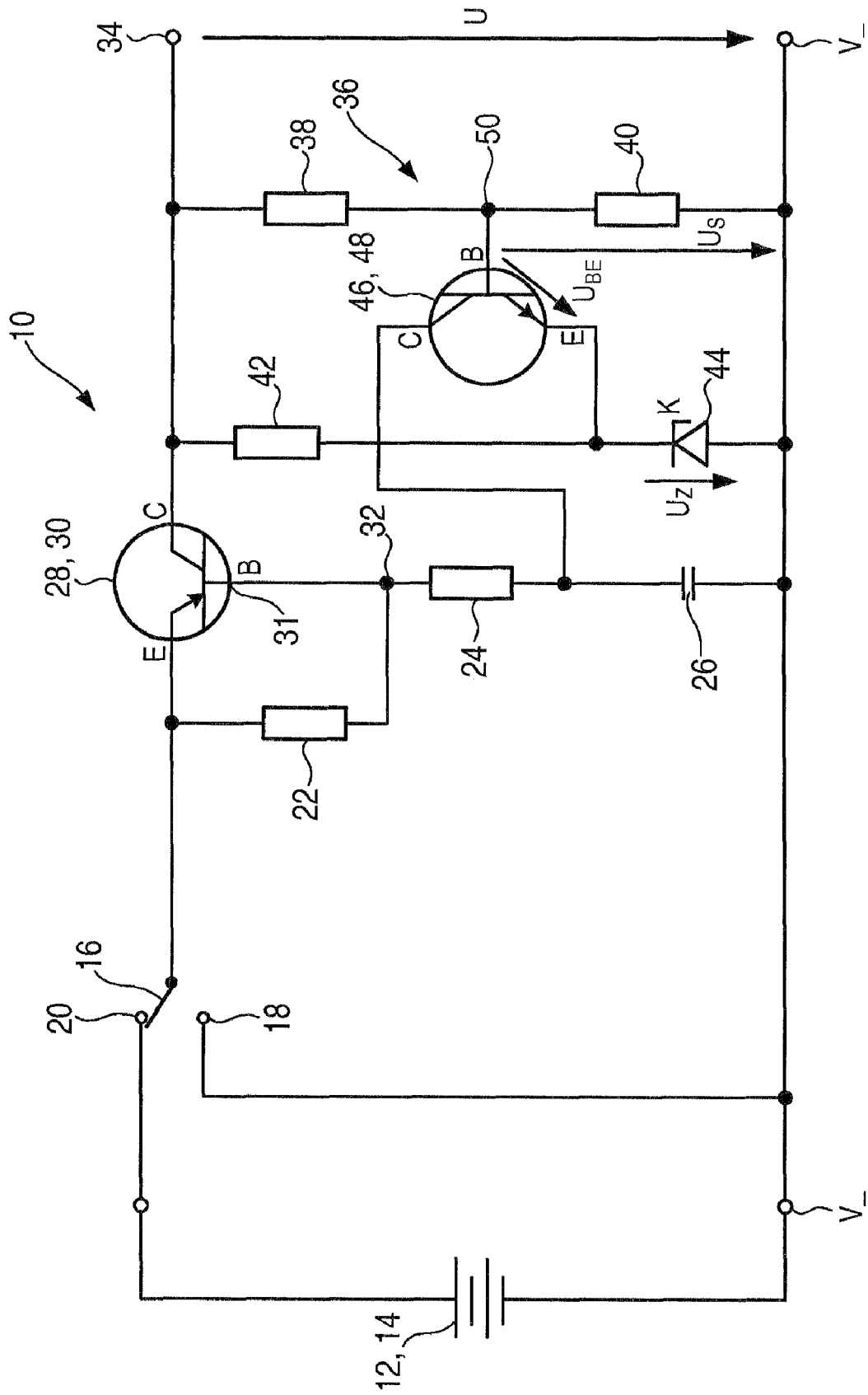

CIRCUIT ARRANGEMENT FOR DETECTING UNDERVOLTAGE IN AN ENERGY SOURCE

CROSS-REFERENCE

The invention described and claimed hereinbelow is also described in PCT/EP2007/054034, filed on Apr. 25, 2007 and DE 10 2006 028 708.8, filed on Jun. 20, 2006. This German Patent Application, whose subject matter is incorporated here by reference, provides the basis for a claim of priority of invention under 35 U.S.C. 119 (a)-(d).

BACKGROUND OF THE INVENTION

The invention relates to a circuit arrangement for detecting undervoltage in an energy source.

Particularly in cordless electrical devices, undervoltage detection is an important function. A suitable circuit arrangement makes it possible to avoid an exhaustive discharge of the rechargeable battery. Since certain electrical components and circuits function improperly, if the supply voltage is too low, undervoltage detection can be quite helpful in conjunction with other energy sources as well.

From European Patent Disclosure EP-A 0698794, a circuit arrangement for undervoltage detection in an energy source is known, having a reference voltage source, which is supplied from the energy source and whose output is carried to a first input of a comparator. The circuit arrangement furthermore has means for dividing the voltage furnished by the energy source, whose output voltage is delivered to a second input of the comparator, and at one output of the comparator, a detection signal can be picked up with the aid of which an electrical device can be deactivated in the event of an undervoltage.

Corresponding circuit arrangements that have both a reference voltage source and a comparator are known from U.S. Pat. No. 3,670,246, European Patent Disclosure EP-A 0207159 and U.S. Pat. No. 5,508,874, among other sources. All these circuit arrangements involve relatively major expense for components, since among other things, the reference voltage sources are comparatively complex in their construction.

SUMMARY OF THE INVENTION

Compared to the prior art, the circuit arrangement of the invention for detecting undervoltage in an energy source, having a transistor switch and at least one further switch means, has the advantage of a very simple, economical construction as well as very low current consumption after a undervoltage shutoff has been effected. To that end, the transistor switch and the further switch means are of low impedance in an operating state of the circuit arrangement, and the transistor switch blocks the further switch means for interrupting the voltage supply if a supply voltage of the energy source is below a defined voltage value. It is thus very simple and economical to prevent not only an exhaustive discharge of a rechargeable battery used as an energy source but also damage to an electrical device operated with the energy source.

Advantageously, the defined voltage value is formed of the sum of a Zener voltage of a Zener diode and a threshold voltage of the transistor switch, and thus a complicated, expensive reference voltage source and a correspondingly designed comparator can be dispensed with. The monitoring of the supply voltage is done by means of a voltage divider, which is connected to the transistor switch, and the transistor switch blocks, if the supply voltage, monitored by means of the voltage divider, drops below the defined voltage value. In this regard, the transistor switch is an NPN bipolar transistor, and the base of the NPN bipolar transistor is connected to the voltage divider, the emitter of the NPN bipolar transistor is connected to the cathode of the Zener diode, and the collector of the NPN bipolar transistor is connected to a switch input of the further switch means. It is thus possible to implement undervoltage detection and shutoff with only two electrically triggered switch means. The further switch means may be a transistor or a relay, for instance.

Resetting the circuit arrangement to the original operating state after an undervoltage shutoff has been effected is done by means of a switchover means or momentary switch. If the electrical device is an electric power tool, for instance, then its ON/OFF switch or main switch can function as a switchover means or momentary switch, so that no further user control element is necessary.

Advantageously, the circuit arrangement is embodied as a component of the electrical device. However, it is also possible for it to be part of the energy source.

BRIEF DESCRIPTION OF THE DRAWINGS

The invention is described below as an example, in conjunction with the sole drawing FIGURE. The description and the claims include numerous characteristics in combination. One skilled in the art will consider these characteristics individually as well and put them together to make further appropriate combinations. In particular, one skilled in the art will also combine the characteristics of different exemplary embodiments to make further appropriate combinations.

FIG. 1 shows a block circuit diagram of the circuit arrangement of the invention for detecting undervoltage in an energy source.

DETAILED DESCRIPTION OF THE PREFERRED EMBODIMENTS

In FIG. 1, a block circuit diagram is shown of the circuit arrangement 10 of the invention for detecting undervoltage in an energy source 12. Both the circuit arrangement 10 and the energy source 12 can be located in the interior of an electrical device, not shown, such as an electric power tool or the like, and the energy source 12 is embodied as a rechargeable battery 14. It is furthermore possible for the circuit arrangement 10 to be a component of the energy source 12. By means of a switchover means or momentary switch 16, the energy source 12 can be connected electrically conductively to the circuit arrangement 10 and disconnected from it. If the switchover means or momentary switch 16 is in the lower position 18, then the supply voltage U at the output of the circuit arrangement 10 has the value of zero, and the electrical device is deactivated, or in other words is in the state of repose.

By putting the switchover means or momentary switch 16 into the upper position 20, a series circuit, comprising a first and second resistor 22 and 24 and a capacitor 26, is connected to the energy source 12, and the capacitor 26 is charged via the resistors 22 and 24. A switch means 30 embodied as a PNP bipolar transistor 28 is located parallel to the first resistor 22 in such a way that its emitter E is connected to the switchover means or momentary switch 16, while a switch input 31, designed as the base B, is located at a node point 32 between the first and second resistors 22 and 24, and the supply voltage U can be picked up at the collector C. During the charging of the capacitor 26, the charge current causes a voltage drop at the resistor 22 and accordingly via the base-to-emitter path of the bipolar transistor 28 as well. If the voltage then increases to such an extent that the threshold voltage of the base-to-emitter junction is exceeded, then the PNP bipolar transistor 28 is made conducting. At the output 34 of the circuit arrangement 10, which output is connected directly to the collector C of the PNP bipolar transistor 28, the supply voltage U is then present, which is the result of the voltage of the energy source 12, minus the collector-to-emitter voltage of the PNP bipolar transistor 28.

Between the collector C of the PNP bipolar transistor 28 and the reference potential V of the energy source 12, there is a voltage divider 36, which comprises two further resistors 38 and 40 and by way of which the supply voltage U for the electrical device is picked up. Parallel to the voltage divider 36 is a series circuit, comprising a series resistor 42 and a Zener diode 44; a defined Zener voltage $U_Z$, which acts as a reference voltage for the undervoltage detection explained hereinafter, drops across the Zener diode 44 that is polarized in the blocking direction. To that end, the base B of a transistor switch 48, embodied as an NPN bipolar transistor 46, is connected to a node point 50 between the two resistors 38 and 40 of the voltage divider 36, while the emitter E is connected to the cathode K of the Zener diode 44, and the collector C is connected between the capacitor 26 and the second resistor 24. The resistor 38 and 40 of the voltage divider 36 are now dimensioned such that during normal operation of the circuit arrangement 10, a voltage that exceeds a defined voltage value $U_S$ drops at the node point 50. The defined voltage value $U_S$ results from the sum of the Zener voltage $U_Z$ and the threshold voltage $U_{BE}$ for making the base-to-emitter junction of the NPN bipolar transistor 46 conducting.

If in the course of the operation of the electrical device, a reduction in the supply voltage U occurs, for instance as a consequence of overly severe discharging of the rechargeable battery 14, then the NPN bipolar transistor 46 blocks, if the voltage dropping at the node point 50 across the resistor 40 is below the defined voltage value $U_S$ and thus below the requisite threshold voltage $U_{BE}$. Since the charging of the capacitor 26 has meanwhile ended, an adequate charging current can no longer flow through the first and second resistors 22 and 24, and thus the voltage drop at the first resistor 22 is below the requisite threshold voltage required for making the switch means 30 conducting. The switch means 30 thereupon blocks, causing an interruption in the voltage supply at the output 34 of the circuit arrangement 10. Because of this "setting to zero" of the supply voltage U, an exhaustive discharge of the rechargeable battery 14 can be effectively prevented. The circuit arrangement 10 is now in a blocked state. Because of the especially slight current consumption of the circuit arrangement 10 in the blocked state, it continues to be assured that there is practically no load on the rechargeable battery 14, with the switchover means or momentary switch 16 in its upper position 20.

To reset the circuit arrangement from the blocked state to the operating state again, an actuation of the switchover means or momentary switch 16 is necessary. To that end, this element is first moved from the upper position 20 to the lower position 18, so that the capacitor 26 discharges via the two resistors 22 and 24. If the switchover means or momentary switch 16 is then returned to the upper position 20, then during the charging of the capacitor 26, the switch means 30 assumes a low-impedance state—as described above—so that once again, the supply voltage U is present at the output 34 of the circuit arrangement 10. The transistor switch 48, however, is made conducting only if the proportion of the supply voltage U that is dropping across the resistor 20 of the voltage divider 36 is greater than the defined voltage value $U_S$. If that is so, then the circuit arrangement 10 can be used again for undervoltage detection and shutoff of the energy source 12.

If in the meantime the rechargeable battery 14 has not been charged, then the actuation of the switchover means or momentary switch 16, while it does cause the switch means 30 to be conducting during the charging of the capacitor 26, nevertheless the transistor switch 48, because of the overly low supply voltage U, is not activated, and thus the switch means 30, after the charging of the capacitor 26 has ended, blocks again, and the supply voltage U again assumes the value of zero. Accordingly, a supply voltage U≠0 V is present only briefly at the output 34. However, any impairment of the electrical device from this brief undervoltage can be precluded. Resetting the circuit arrangement 10 to the operating state is thus possible only if the rechargeable battery 14 has in the meantime been charged enough that the voltage dropping across the resistor 40 of the voltage divider 36 exceeds the defined voltage value $U_S$.

It is also possible, without restricting the scope of the invention, to actuate the switchover means or momentary switch 16 during normal operation, that is, with appropriate voltage supply to the electrical device. As already described, discharging of the capacitor 26 then occurs via the resistors 22 and 24. Unlike what happens upon actuation of the switchover means or momentary switch 16 during the blocking state, the switch means 30 and the transistor switch 46 are now moved from the low-impedance state to the high-impedance or in other words blocking state, and the supply voltage U is set to the value of zero. After another actuation of the switchover means or momentary switch 16 from the lower position 18 to the upper position 20, the circuit arrangement 10 is again in the operating state, as described above.

As the electrical device, an electric power tool can preferably be used, with which the circuit arrangement 10 is integrated. In this connection, it is expedient if the switchover means or momentary switch 16 is embodied as a user control element accessible from outside—such as the ON/OFF switch or main switch—of the electric power tool. The lower position 18 of the switchover means or momentary switch 16 should correspond to a resting position of the user control element, while the actuation of this element is equivalent to moving to the upper position 20. If the electrical device is a cordless screwdriver, for instance, then an electric motor is supplied with energy by actuating the ON/OFF switch and keeping it pressed down. If during operation or immediately after the actuation of an ON/OFF switch the circuit arrangement 10 detects an undervoltage in the supply voltage U applied to the electric motor, then it sets that voltage to the value of zero in the manner described above. The user of the cordless screwdriver can be informed of this operation by means of an LED, for instance, or other display means. If the user lets the ON/OFF switch go again, then the switch is put in the lower position 18, and the circuit arrangement 10 is reset as described above. It is possible to embody the circuit arrangement 10 as a component of the electrical device or of the energy source 12. In the latter case, it is expedient that the energy source 12 has suitably embodied contacts for connecting the circuit arrangement 10 to the switchover means or momentary switch 16 of the electrical device. However, that can be dispensed with, if the switchover means or momentary switch 16 is also located in the energy source 12. The aforementioned display means can also be located on the electrical device and/or in the energy source 12.

In closing, it should also be pointed out that the provision of exact values for the components of the circuit arrangement 10 has been dispensed with here, because they depend, among other factors, on the energy demand of the electrical device and accordingly on its load rating. One skilled in the art in the field of electrical engineering will be capable of dimensioning the components appropriately. It is also possible for further switch means 30 to be embodied as a relay. When especially high power is demanded, insulated gate bipolar transistors (IGBTs) can also be used as the transistor switch 48 or further switch means 30. The use of suitably designed field effect transistors is conceivable as well.

The invention claimed is:

1. A circuit arrangement (10) for detecting undervoltage in an energy source (12), comprising:
   a transistor switch (48); and
   at least one further switch means (30), wherein the transistor switch (48) and the further switch means are of low impedance in an operating state of the circuit arrangement (10), and the transistor switch (48) blocks the further switch means (30) for interrupting the voltage supply if a supply voltage (U) of the energy source (12) is below a defined voltage value ($U_s$),
   wherein the defined voltage value ($U_s$) is proportional to the sum of a Zener voltage ($U_z$) of a Zener diode (44) and a threshold voltage ($U_{BE}$) of the transistor switch (48), wherein said transistor switch (48) and said Zener diode (44) are connected downstream from said further switch means (30) with respect to said energy source (12).

2. The circuit arrangement (10) as defined by claim 1 wherein the transistor switch (48) is connected to a voltage divider (36) for monitoring the supply voltage (U).

3. The circuit arrangement (10) as defined by claim 2, wherein the transistor switch (48) blocks, if the supply voltage (U), monitored by means of the voltage divider (36), drops below the defined voltage value ($U_s$).

4. The circuit arrangement (10) as defined by claim 1, wherein the transistor switch (48) is an NPN bipolar transistor (46), and the base (B) of the NPN bipolar transistor (46) is connected to the voltage divider (36), the emitter (E) of the NPN bipolar transistor (46) is connected to the cathode (K) of the Zener diode (44), and the collector (C) of the NPN bipolar transistor (46) is connected to a switch input (31) of the further switch means.

5. The circuit arrangement (10) as defined by claim 1, wherein the circuit arrangement is capable of being reset into the operating state by means of a switchover means or momentary switch (16).

6. The circuit arrangement (10) as defined by claim 1, wherein the at least one further switch means (30) is embodied as a PNP bipolar transistor (28) or as a relay.

7. An energy source (12), comprising:
   a circuit arrangement (10) having a transistor switch (48); and at least one further switch means (30), wherein the transistor switch (48) and the further switch means are of low impedance in an operating state of the circuit arrangement (10), and the transistor switch (48) blocks the further switch means (30) for interrupting the voltage supply if a supply voltage (U) of the energy source (12) is below a defined voltage value ($U_s$), and wherein the defined voltage value ($U_s$) is proportional to the sum of a Zener voltage ($U_z$) of a Zener diode (44) and a threshold voltage ($U_{BE}$) of the transistor switch (48), wherein said transistor switch (48) and said Zener diode (44) are connected downstream from said further switch means (30) with respect to said energy source (12).

8. The energy source (12) as defined by claim 7, wherein the energy source (12) is a rechargeable battery (14).

9. An electrical device, comprising:
   a circuit arrangement (10) having a transistor switch (48); and at least one further switch means (30), wherein the transistor switch (48) and the further switch means are of low impedance in an operating state of the circuit arrangement (10), and the transistor switch (48) blocks the further switch means (30) for interrupting the voltage supply if a supply voltage (U) of the energy source (12) is below a defined voltage value ($U_s$), and wherein the defined voltage value ($U_s$) is proportional to the sum of a Zener voltage ($U_z$) of a Zener diode (44) and a threshold voltage ($U_{BE}$) of the transistor switch (48), wherein said transistor switch (48) and said Zener diode (44) are connected downstream from said further switch means (30) with respect to said energy source (12).

10. The electrical device as defined by claim 9, wherein the electrical device is an electric power tool.

* * * * *